United States Patent
Choi et al.

(10) Patent No.: US 11,233,112 B2
(45) Date of Patent: *Jan. 25, 2022

(54) DISPLAY DEVICE

(71) Applicant: SAMSUNG DISPLAY CO., LTD., Yongin-si (KR)

(72) Inventors: Yoon Sun Choi, Yongin-si (KR); Sang Jo Lee, Yongin-si (KR); Yong Jae Park, Yongin-si (KR); Mi Jin Yoon, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/507,253

(22) Filed: Jul. 10, 2019

(65) Prior Publication Data

US 2019/0333982 A1 Oct. 31, 2019

Related U.S. Application Data

(63) Continuation of application No. 15/419,103, filed on Jan. 30, 2017, now Pat. No. 10,367,050.

(30) Foreign Application Priority Data

May 23, 2016 (KR) .................. 10-2016-0062766

(51) Int. Cl.
*H01L 27/32* (2006.01)
*H01L 51/00* (2006.01)
*H01L 51/52* (2006.01)

(52) U.S. Cl.
CPC ...... *H01L 27/3276* (2013.01); *H01L 51/0097* (2013.01); *H01L 51/5237* (2013.01); *H01L 2251/5338* (2013.01); *Y02E 10/549* (2013.01)

(58) Field of Classification Search
CPC ............ H01L 27/3276; H01L 51/0097; H01L 51/5237; H01L 2251/5338; H01L 27/3244;
(Continued)

(56) References Cited

U.S. PATENT DOCUMENTS 10,367,050 B2 * 7/2019 Choi .................. H01L 51/0097
2009/0021666 A1 1/2009 Chen
(Continued)

FOREIGN PATENT DOCUMENTS

JP 2013015836 A * 1/2013 ............ G06F 3/041
KR 10-2013-0061156 A 6/2013
(Continued)

OTHER PUBLICATIONS

Machine English Translation of KR1020140099174A, Kwon et al. (Year: 2014).*

*Primary Examiner* — Rajarshi Chakraborty
*Assistant Examiner* — Glenn D Zimmerman
(74) *Attorney, Agent, or Firm* — Kile Park Reed & Houtteman PLLC

(57) ABSTRACT

A display device includes a display panel includes a display area in which an image is displayed and a first non-display area in which a pad portion is located. The display panel includes a first bending portion in the display area, the first bending portion being bent at a first curvature radius, and a second bending portion in the first non-display area, the second bending portion being bent at a second curvature radius that is smaller than the first curvature radius.

30 Claims, 15 Drawing Sheets

(58) Field of Classification Search
CPC ....... H01L 51/56; Y02E 10/549; H05K 3/361; G09G 2300/0426
See application file for complete search history.

(56) References Cited

U.S. PATENT DOCUMENTS

| | | |
|---|---|---|
| 2013/0000025 A1 | 1/2013 | Jin et al. |
| 2014/0002385 A1 | 1/2014 | Ka et al. |
| 2014/0340855 A1 | 11/2014 | Lee et al. |
| 2015/0102298 A1 | 4/2015 | Namkung et al. |
| 2016/0062018 A1* | 3/2016 | Namkung ........... H01L 27/3276 257/88 |
| 2016/0181345 A1* | 6/2016 | Lee .................... H01L 51/0097 257/40 |
| 2016/0293869 A1* | 10/2016 | Saeki ................. H01L 27/3276 |
| 2017/0098794 A1 | 4/2017 | Cho et al. |
| 2018/0059728 A1 | 3/2018 | Kim et al. |

FOREIGN PATENT DOCUMENTS

| | | |
|---|---|---|
| KR | 10-2014-0099174 A | 8/2014 |
| KR | 10-2014-0108827 A | 9/2014 |
| KR | 10-2015-0061769 A | 6/2015 |

* cited by examiner

DISPLAY DEVICE

CROSS-REFERENCE TO RELATED APPLICATIONS

This is a continuation application based on pending application Ser. No. 15/419,103, filed Jan. 30, 2017, the entire contents of which is hereby incorporated by reference.

Korean Patent Application No. 10-2016-0062766, filed on May 23, 2016, in the Korean Intellectual Property Office, and entitled: "Display Device," is incorporated by reference herein in its entirety.

BACKGROUND

1. Field

The present disclosure relates to a display device.

2. Description of the Related Art

Display devices such as an organic light emitting display device and a liquid crystal display device are manufactured by disposing various layers and various elements on a substrate.

SUMMARY

Embodiments are directed to a display device including a display panel including a display area in which an image is displayed and a first non-display area in which a pad portion is located. The display panel includes a first bending portion in the display area, the first bending portion being bent at a first curvature radius, and a second bending portion in the first non-display area, the second bending portion being bent at a second curvature radius that is smaller than the first curvature radius.

The second bending portion may be between the first bending portion and the pad portion.

The display panel may include a first area between the first bending portion and the second bending portion. The first area may be bent at a third curvature radius that is greater than the first curvature radius.

The display panel may include a first area between the first bending portion and the second bending portion. The first area may be partially located in the display area and partially located in the first non-display area.

The display panel may include a second area outside the second bending portion in the first non-display area. The second area may be bent at a curvature radius that is greater than the third curvature radius, or may be substantially flat.

The pad portion may be in the second area.

The display device may further include a flexible printed circuit board that is attached to the pad portion.

The display device may further include a driving circuit chip that is mounted on the flexible printed circuit board.

The display device may further include a driving circuit chip that is mounted on the second area.

The display panel may include a main area that is substantially flat. The second bending portion may be in an overlapping relationship with the first bending portion or with the main area in a direction perpendicular to a surface of the main area.

The second area may be located such that an edge thereof is toward the main area.

The first bending portion may have a curvature radius that is equal to or greater than about 1 mm.

The second bending portion may have a curvature radius of less than about 1 mm.

The display device may further include a supporter that is located in a bending interspace limited by the first bending portion and the second bending portion.

At least one of the first area and the second area may be attached to the supporter.

The supporter may include a support layer and adhesive layers respectively located on opposite surfaces of the support layer.

The support layer may include at least one of polypropylene, polyethylene terephthalate, polyimide, and polyolefin.

The display device may further include a supporter that includes a recess portion that accommodates the second bending portion.

The supporter may include a flat bottom portion that presses the flexible printed circuit board.

The display panel may include a second non-display area. The display panel may include a third bending portion that is located in the display area and is bent at a third curvature radius based on a bending axis extending in a different direction from a bending axis of the first bending portion, and a fourth bending portion that is located in the second non-display area and is bent at a fourth curvature radius that is smaller than the third curvature radius.

The display panel may include a third area between the third bending portion and the fourth bending portion and a fourth area outside the fourth bending portion in the second non-display area. The display panel may include a main area that is substantially flat. The fourth area may be located such that an edge thereof is toward the main area.

The display panel may include a third non-display area. The display panel may include a fifth bending portion that is located in the display area and is bent at a fifth curvature radius based on a bending axis extending in a different direction from a bending axis of the first bending portion, and a sixth bending portion that is located in the second non-display area and is bent at a sixth curvature radius that is smaller than the fifth curvature radius.

Embodiments are also directed to a display device including a display panel including a display area and a non-display area, the non-display area being at an edge of the display area, the display area including a first bending portion, and the non-display area including a second bending portion. The display area displays an image that is viewable from a front side of the display panel. The first bending portion and the second bending portion are bent such that the non-display area is blocked from view from the front side of the display panel by the first bending portion.

The display device may further include a first area between the first bending portion and the second bending portion. A boundary between the display area and the non-display area may be located in the first area. The first bending portion may be bent in a direction away from the front side of the display panel at a first curvature radius. The first area may be either not bent or is bent at a third curvature radius that is greater than the first curvature radius. The second bending portion may be bent from the first area in a direction toward a rear side of the display panel at a second curvature radius that is smaller than the first curvature radius.

The non-display area may further include a second area extending at an end of the second bending portion in a direction toward the rear side of the display panel, the second area being connected to a flexible printed circuit board or driving chip.

The display device may further include a supporter located in an inner space defined by the first bending portion, the first area, the second bending portion, the second area, and a portion of the rear side of the display panel adjacent to the first bending portion.

The supporter may be adhesively attached to at least two of the first bending portion, the first area, the second bending portion, the second area, and the portion of the rear side of the display panel adjacent to the first bending portion.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
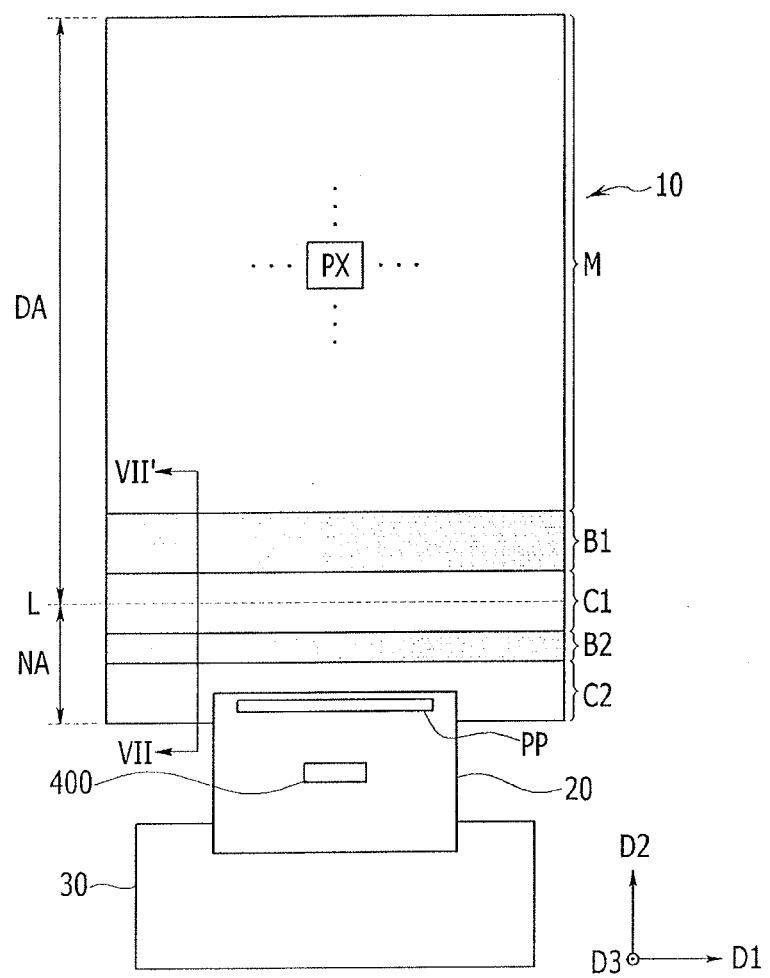
FIG. 1 illustrates a top plan view schematically depicting a display device according to an embodiment in a state before the display device is bent.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

Hereafter, an organic light emitting diode (OLED) display as a display device is exemplarily described, aspects described herein may be applicable to other display devices.

Figure 2:
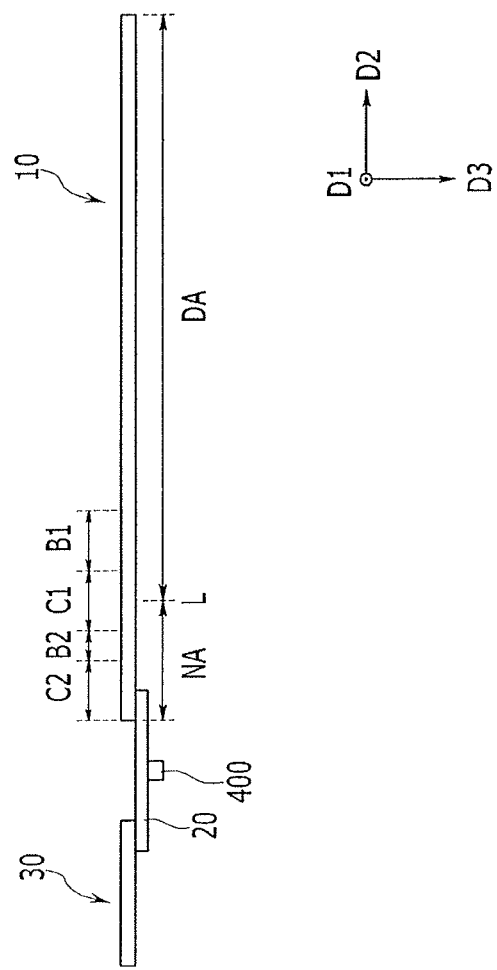
FIG. 2 illustrates a side view of the display device illustrated in FIG. 1.

FIG. 1 illustrates a top plan view schematically depicting a state before a display device according to an exemplary embodiment is bent, and FIG. 2 is a side view of the display device illustrated in FIG. 1.

Referring to FIG. 1 and FIG. 2, a display device according to an exemplary embodiment may include a display panel 10, and flexible printed circuit boards (PCBs) 20 and 30 connected to the display panel 10.

The display panel 10 may include a display area DA for displaying an image, and a non-display area NA in which elements and/or wires for generating and/or transmitting various signals applied to the display area DA are disposed, the non-display area NA being disposed outside of the display area DA. In FIG. 1, a boundary L of the display area DA and the non-display area NA is indicated by a dotted line. A wide area of the display panel 10 above the dotted line in FIG. 1 corresponds to the display area DA, and a narrow area of the display panel 10 below the dotted line area in FIG. 1 corresponds to the non-display area NA. In FIG. 1, only a lower area of the display panel 10 is illustrated as including the non-display area NA, but it is to be understood that left and right edges of the display panel 10 and/or an upper edge of the display panel 10 may include a non-display area NA.

In the display area DA of the display panel 10, a plurality of pixels PX are disposed, for example, in a matrix direction. Signal lines such as a plurality of gate lines, a plurality of data lines, and a plurality of driving voltage lines may be disposed in the display area DA. The plurality of gate lines may substantially extend in a first direction D1 (e.g., a row direction), and the plurality of data lines and the plurality of driving voltage lines may extend in a second direction D2 (e.g., a column direction) crossing the first direction D1. In each pixel PX, the gate line, the data line, and the driving voltage line may be connected to receive a gate signal, a data signal, and a driving voltage therethrough.

A pad portion PP (see FIG. 1) for receiving a signal from the display panel 10 may be disposed in the non-display area NA of the display panel 10, and one end of a first flexible printed circuit board 20 may be connected to the pad portion PP. The other end of the first flexible printed circuit board 20 may be connected to the second flexible printed circuit board 30. The second flexible printed circuit board 30 may be connected to an external device such as, for example, an external printed circuit board to transmit a signal such as image data.

A driver that generates and/or processes various signals for driving the display panel 10 may be disposed in the non-display area NA or may be disposed in the first flexible printed circuit board 20 connected to the pad portion PP. The driver may include a data driver that applies a data signal to the data line, a gate driver that applies a gate signal to the gate line, and a signal controller that controls the data driver and the gate driver.

As shown in FIG. 1, the data driver may be mounted on the first flexible printed circuit board 20 as an integrated circuit chip 400 and may be connected to the pad portion PP as a tape carrier package (TCP). In some implementations, the data driver may be mounted on the non-display area NA between the display area DA and the pad portion PP. The gate driver may be an integrated circuit chip. In some implementations, the gate driver may be integrated in the non-display area of left/right edges of the display panel 10. The signal controller may be included in the integrated circuit chip 400 that includes the data driver or may be provided as an independent integrated circuit chip. When the integrated circuit chip 400 is mounted on the non-display area NA of the display panel 10, the first flexible printed circuit board 20 may be omitted and the second flexible printed circuit board 30 may be attached to the pad portion PP.

The display panel 10 may include first and second bending portions B1 and B2. The first bending portion B1 may be disposed in the display area DA close to the non-display area NA, and the second bending portion B2 may be disposed in the non-display area NA. The display panel 10 may be bent at the first and second bending portions B1 and B2. A main area M at an upper side of the first bending portion B1 of the display panel 10 may not be bent, but instead may be substantially maintained in a flat state. A first area C1 may be disposed between the first bending portion B1 and the second bending portion B2, and a second area C2 may be disposed at the outside of the second bending portion B2. The pad portion PP may be disposed at the second area C2.

The entire configuration of the display device has been schematically described with reference to FIGS. 1 and 2 which illustrate a state before the display panel 10 is bent. Hereinafter, the display panel 10 in a bent state as a complete product will be described in detail in relation to bending thereof, with reference to FIG. 3 and FIG. 4.

Figure 3:
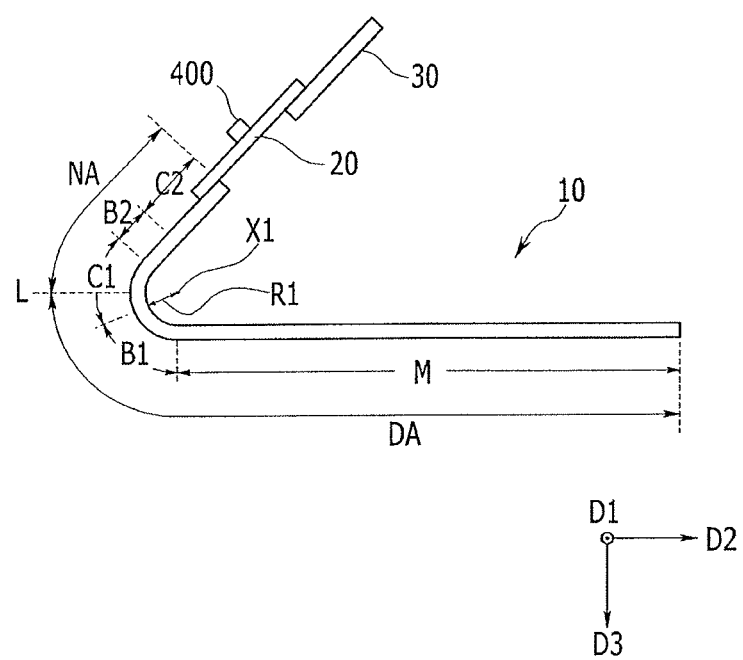
FIG. 3 and FIG. 4 respectively illustrate side views after the display device illustrated in FIG. 1 is bent once and after the display device is bent twice.
Figure 4:
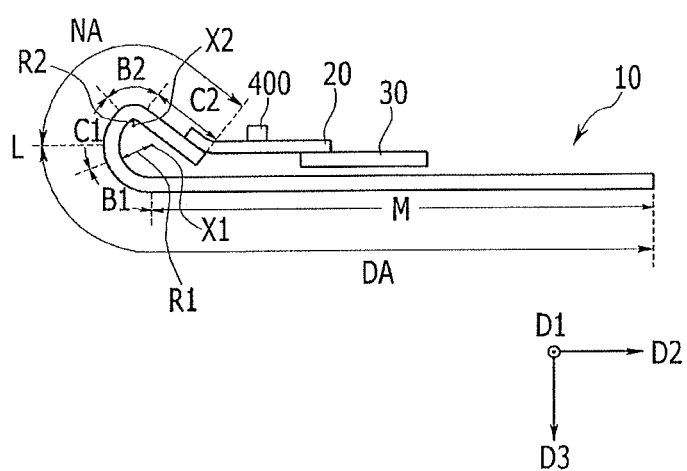

FIG. 3 and FIG. 4 respectively illustrate side views after the display device illustrated in FIG. 1 is bent once and then bent twice according to an exemplary embodiment.

The display panel 10 may be bent in the first bending portion B1 and the second bending portion B2. For example, the display panel 10 may be bent twice. Referring to FIG. 3, the display panel 10 may be bent in the first bending portion B1. A degree of bending in the first bending portion B1 may depend upon physical characteristics such as thickness, flexibility, and a Young's modulus of the first bending portion B1. Moreover, since the first bending portion B1 is disposed in the display area DA, the bending may be performed to a degree such that various wires and elements in the display area DA are not damaged.

The first bending portion B1 may be bent at a first curvature radius R1 based on a first bending axis X1 extending in the first direction D1. The first curvature radius R1 may be defined as the shortest distance from the first bending axis X1 to the first bending portion B1. The first curvature radius R1 may be, for example, equal to or greater than about 1 mm. In some implementations, the first curvature radius may be about 2 mm to 6 mm. When the first bending portion B1 of the display panel 10 is bent, the non-display area NA of the display panel 10 may be disposed to be opposite to a third direction D3 corresponding to a rear side of the display area DA, for example, a front surface (a surface on which an image is displayed) of the display panel 10. Accordingly, a dead space that is present when the non-display area NA is disposed in the same planar surface as the display area DA before being bent as shown in FIG. 2, may be removed in a parallel direction to the second direction D2. As the first curvature radius R1 becomes smaller, an area occupied by the first bending portion B1 in the entire display panel 10 may decrease.

Referring to FIG. 4, the display panel 10 may be bent at the second bending portion B2. The display panel 10 may be substantially bent at the first bending portion B1 and at the second bending portion B2 to be in a state as shown in FIG. 4. The second bending portion B2 may be disposed between the first bending portion B1 and the pad portion PP. A degree of bending in the second bending portion B2 may depend on physical characteristics of the second bending portion B2. When the second bending portion B2 is disposed in the non-display area NA, the bending may be performed to a degree such that various wires in the non-display area NA are not damaged.

The second bending portion B2 may be bent at a second curvature radius R2 based on a second bending axis X2 extending in the first direction. The second curvature radius R2 may be defined as the shortest distance from the second bending axis X2 to the second bending portion B2. The second curvature radius may be smaller than the first curvature radius R1. For example, the second curvature radius R2 may be less than about 1 mm, or, for example, about 0.1 mm to about 0.4 mm. When the display panel 10 is bent at the second curvature radius R2 in the second bending portion B2, the display panel 10 may become thicker in the third direction corresponding to a thickness direction thereof, thereby reducing a dead space of the direction parallel to the third direction.

The second bending portion B2 may be covered by the first bending portion B1 or the main area M of the display panel 10. Accordingly, the second bending portion may not be viewable from a front side of the display panel 10. For example, the second bending portion B2 may be in an overlapping relationship with the first bending portion B1 or with the main area M in a direction (third direction) perpendicular to a planar surface of the main area M.

The first area C1 disposed between the first bending portion B1 and the second bending portion B2 may include the boundary L between the display area DA and the non-display area NA. Accordingly, the first area C1 may be partially disposed in the display area DA and partially disposed in the non-display area NA. When the display panel 10 is viewed from a front side thereof, the first area C1 may form one edge of the display panel 10. For example, a portion of the first area C1 that protrudes most in a parallel direction to the second direction D2 corresponds to an edge thereof. A portion of the first area C1 corresponding to the display area DA may be disposed to be viewable from a front side of the display panel 10, but a portion of the first area C1 corresponding to the non-display area NA may be disposed to not be viewable from the front side of the display panel 10.

When the first area C1 is disposed between the first bending portion B1 and the second bending portion B2, the first area C1 may be bent at a predetermined curvature radius. For example, the first area C1 may be bent at substantially the same curvature radius as the first curvature radius R1. The first area C1 may be bent based on the first bending axis X1.

When the first bending portion B1 and some of the first area C1 are disposed in the display area DA, the first bending portion Ba and the some of the first area C1 may serve as a screen for displaying an image. However, in some implementations, when the first bending portion B1 is curved, if it is intended that an image be displayed only on a flat portion of the display panel 10, for example, only the main area M, the first area C1 and at least some of the first bending portion B1 may be covered by a bezel, etc. to not be viewable.

The non-display area NA may include the second area C2 at an outer side of the second bending portion B2. The pad portion PP may be disposed in the second area C2, and the first flexible printed circuit board 20 may be attached to the pad portion PP. A driving circuit chip may be mounted, for example, between the second bending portion B2 and the pad portion PP in the second area C2. While the display panel 10 is being bent, the second area C2 may not be bent, but instead may be maintained to be substantially flat. In some implementations, the second area C2 may be slightly bent.

When the second bending portion B2 is bent at a smaller second bending curvature R2, the second area C2 may be disposed to not be substantially parallel to a non-bending main area M of the display panel 10 and for an end portion thereof (corresponding to a lower end portion of the display panel 10 in FIG. 1) to face the main area M. Accordingly, when the driving circuit chip 400 mounted on the first flexible printed circuit board 20 and the first flexible printed circuit board 20 is disposed inside a space limited in the third direction (thickness direction) by the main area M of the display panel 10 and the second bending portion B2, the dead space may be minimized.

In relation to FIG. 3 and FIG. 4, it is described that the first bending portion B1 is first bent and then the second bending portion B2 is bent. Such description is not intended to limit a bending order of the bending portions B1 and B2. For example, the second bending portion B2 may be bent, and then, the first bending portion B1 may be bent, or the first and second bending portions B1 and B2 may be substantially simultaneously bent. Although it is described that the first area C1 has substantially the same curvature radius R1 as the first bending portion B1, in some implementations, the first area C1 may have a different curvature radius from the first curvature radius R1 of the first bending portion B1.

Figure 5:
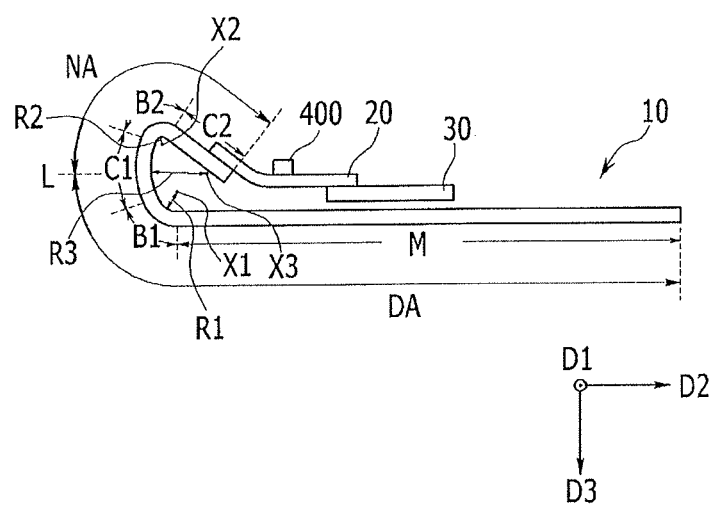
FIG. 5 illustrates a side view after the display device illustrated in FIG. 1 is bent twice according to an exemplary embodiment.

FIG. 5 illustrates a side view after the display device illustrated in FIG. 1 is bent three times according to another exemplary embodiment.

The display panel 10 may be bent at the first curvature radius R1 based on the first bending axis X1 at the first bending portion B1 disposed in the display area DA and may be bent at the second curvature radius R2 based on the second bending axis X2 at the second bending portion B2 disposed in the non-display area NA. The first area C1, which is disposed between the first bending portion B1 and the second bending portion B2 and includes the boundary L between the display area DA and the non-display area NA, may be bent at a third curvature radius R3 based on the third bending axis X3. The third curvature radius R3 may be defined as the shortest distance from the third bending axis X3 to the first area C1. The third curvature radius R3 may be greater than the first curvature radius R1. As such, when the curvature radius R3 of the first area C1 is large, when the display panel 10 is viewed from the front thereof, a protrusion degree of the first area C1, for example, a distance between the main area M and the end portion of first area C1, may be smaller than in the exemplary embodiment of FIG. 4. Accordingly, when it is intended that an image be displayed on only the flat area of the display panel 10, an area covered by the bezel, etc. may be further reduced compared to the exemplary embodiment of FIG. 4, and the dead space may also be further reduced.

A stacked structure of the display panel 10 will now described based on the first bending portion B1 and the second bending portion B2 together with the pixel PX of the display panel 10.

Figure 6:
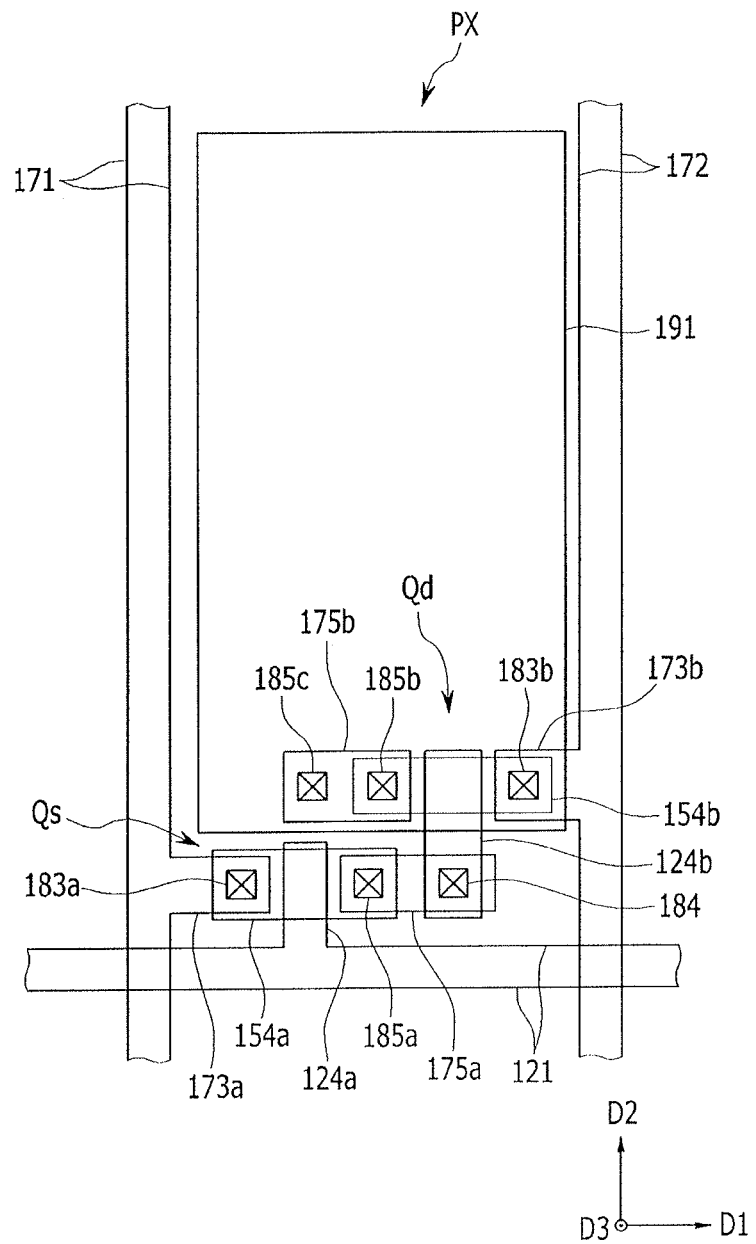
FIG. 6 illustrates a layout view of one pixel area in a display area of the display device illustrated in FIG. 1.
Figure 7:
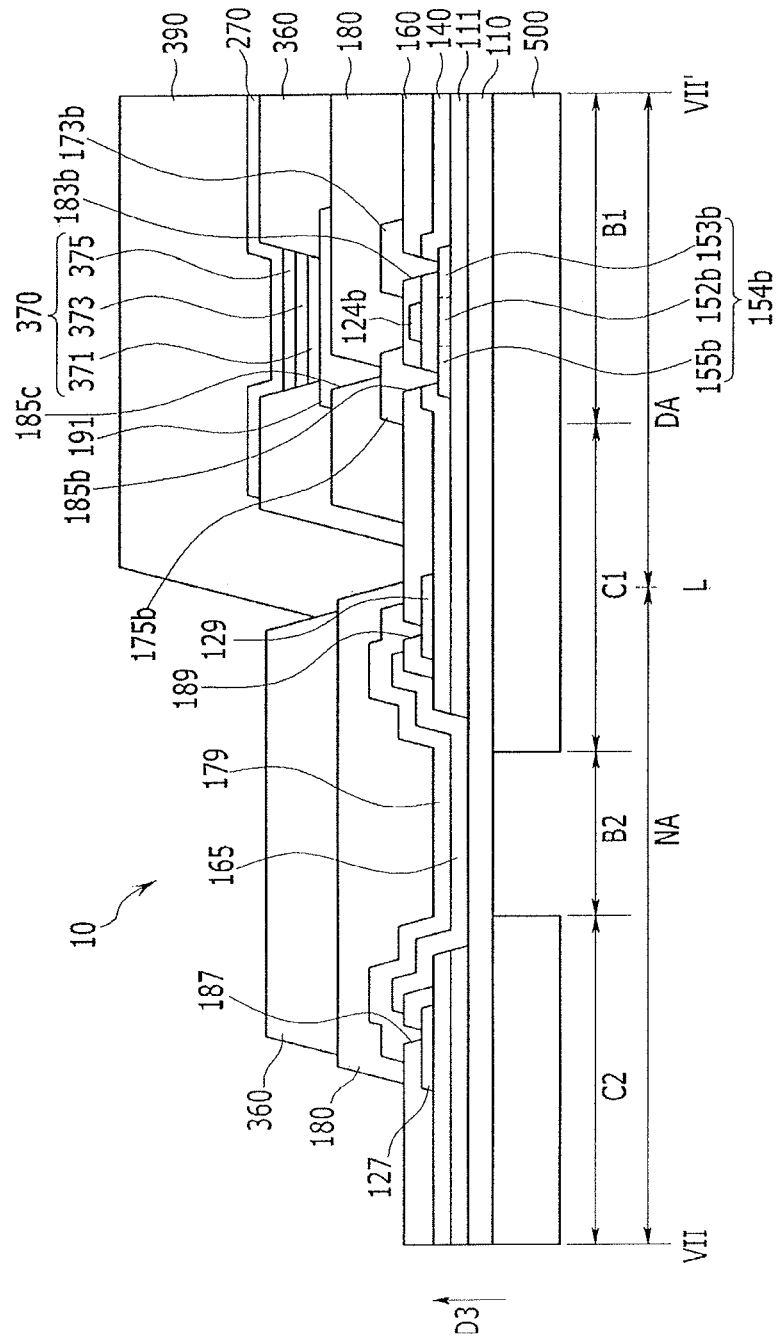
FIG. 7 illustrates a cross-sectional view taken along line VII-VII' of FIG. 1.

FIG. 6 illustrates a layout view of one pixel area disposed in a display area of the display device illustrated in FIG. 1, and FIG. 7 illustrates a cross-sectional view taken along line VII-VII' of FIG. 1.

Referring to FIG. 6, the display device may include a plurality of signal lines 121, 171, and 172 and a plurality of pixels PX connected to the plurality of signal lines.

The signal lines may include a plurality of gate lines 121 that transmit gate signals, a plurality of data lines 171 that transmit data signals, and a plurality of driving voltage lines 172 that transmit driving voltages. The pixel PX may include a switching transistor Qs, a driving transistor Qd, a storage capacitor, and a light-emitting device.

A control terminal of the switching transistor Qs may be connected to the gate line 121, an input terminal thereof may be connected to the data line 171, and an output terminal thereof may be connected to the driving transistor Qd. The switching transistor Qs may respond to a gate signal applied to the gate line 121 to transmit a data signal applied to the data line 171 to the driving transistor Qd.

A control terminal of the driving transistor Qd may be connected to the switching transistor Qs, an input terminal may be connected to the driving voltage line 172, and an output terminal thereof may be connected to a light-emitting device. The driving transistor Qd may allow an output current, an amount of which varies according to a voltage applied between the control terminal and the output terminal, to flow.

A storage capacitor may be connected between the control terminal and the input terminal of the driving transistor Qd. The storage capacitor may be charged by a data signal applied to the control terminal of the driving transistor Qd. The storage capacitor may maintain the charge even after the switching transistor Qs is turned off The light-emitting device, which may be an organic light emitting diode, may include an anode connected to the output terminal of the driving transistor Qd and a cathode connected to a common voltage. The light-emitting device may display an image by emitting light with variable intensity according to an output current of the driving transistor Qd.

The switching transistor Qs and the driving transistor Qd may be an n-channel or a p-channel electric field effect transistor. The switching transistor Qs, the driving transistor Qd, the storage capacitor, and the light-emitting device may be variously connected.

Referring to FIG. 7, the display panel 10 may include a substrate 110 and a plurality of layers disposed on the substrate. Although the plurality of pixels PX may be disposed in the display area DA, only one pixel PX and only one driving transistor Qd will be illustrated and described in order to simplify the drawing of FIG. 7.

The first bending portion B1 may be disposed in the display area DA. Accordingly, the first bending portion B1 may have a stacked structure of the display area DA in which the pixel PX is disposed. The second bending portion B2 may be disposed in the non-display area NA. Accordingly, the second bending portion B2 may have a different stacked structure from the first bending portion B1. For example, the second bending portion B2 may have a stacked structure that may be effectively bent at a small curvature radius of less than about 1 mm. Hereinafter, while mainly describing the display area DA in which the first bending portion B1 is disposed with reference to FIG. 6 and FIG. 7, the non-display area NA in which the second bending portion B2 is disposed will be described in association with a difference from the display area DA.

The substrate 110 may be a flexible substrate made of a transparent polymer film. For example, the substrate 110 may be made of a plastic such as polyimide, polyamide, polyethylene terephthalate, polyethylene naphthalate, polyethylene ether ketone, polycarbonate, polyethylene sulfonate, polyarylate, etc.

A buffer layer 111 may be disposed on the substrate 110 to prevent diffusion of impurities and moisture penetration that could cause a degradation of semiconductor characteristics. The buffer layer 111 may include an inorganic material such as a silicon oxide (SiOx), a silicon nitride (SiNx), aluminum oxide ($Al_2O_3$), hafnium oxide ($HfO_3$), yttrium oxide ($Y_2O_3$), etc. The buffer layer 111 may be formed across an entire surface of the substrate 110. In some implementations, the buffer layer may be omitted from the second bending portion B2.

A first semiconductor 154a and a second semiconductor 154b may be disposed on the buffer layer 111. The first semiconductor 154a may be disposed in a channel region and at opposite sides of the channel region. The first semiconductor 154a may include a source region and a drain region formed by doping. The second semiconductor 154b may be disposed in a channel region 152b and at opposite sides of the channel region 152b. The second semiconductor 154b may include a source region 153b and a drain region 155b formed by doping. The first semiconductor 154a and the second semiconductor 154b may include polysilicon, an oxide semiconductor, or amorphous silicon.

A gate insulating layer 140 including an inorganic material such as a silicon oxide, a silicon nitride, etc. may be disposed on the first semiconductor 154a and the second semiconductor 154b. In some implementations, the gate insulating layer 140 may be disposed at the second bending portion B2.

Gate conductors including the gate line 121, a first gate electrode 124a, a second gate electrode 124b, a first wire 127, and a second wire 129 may be disposed on the gate insulating layer 140. The gate conductor may include metals such as molybdenum (Mo), copper (Cu), aluminum (Al), silver (Ag), chromium (Cr), tantalum (Ta), or titanium (Ti), or metal alloys thereof. For example, the gate conductor may be made of a molybdenum-based metal such as molybdenum or a molybdenum alloy. The first gate electrode 124a may overlap the channel region of the first semiconductor 154a, and the second gate electrode 124b may be overlap the channel region 152b of the second semiconductor 154b. The first wire 127 may be a portion of a wire such as a driving voltage supply line, a common voltage supply line, or a data line that is disposed in the second area C2, and the second wire 129 may be a portion of a wire that is disposed in the first area C1.

An interlayer insulating layer 160 may be disposed on the gate insulating layer 140 and the gate conductor. A contact hole 183a overlapping the source region of the first semiconductor 154a, a contact hole 185a overlapping the drain region thereof, a contact hole 183b overlapping the source region 153b of the second semiconductor 154b, and a contact hole 185b overlapping the drain region 155b thereof may be formed in the interlayer insulating layer 160 and the gate insulating layer 140. A contact hole 187 overlapping the first wire 127 and a contact hole 189 overlapping the second wire 129 may be formed in the interlayer insulating layer 160. The interlayer insulating layer 160 may include an inorganic material such as a silicon oxide, a silicon nitride, a silicon oxynitride (SiON), and a silicon oxyfluoride (SiOF). The interlayer insulating layer 160 may be omitted from the second bending portion B2.

Data conductors including the data line 171, the driving voltage line 172, a first source electrode 173a, a second source electrode 173b, a first drain electrode 175a, a second drain electrode 175b, and a connecting wire 179 may be disposed on the interlayer insulating layer 160. A passivation layer (protective layer) 165 may be disposed between the substrate 110 and the connecting wire 179 in the second bending portion B2. The passivation layer 165 may overlap the gate insulating layer 140 in the first and second areas C1 and C2, and may further overlap the interlayer insulating layer 160. The passivation layer 165 may include an organic material.

The first source electrode 173a and the first drain electrode 175a may be respectively connected to the source region and the drain region of the first semiconductor 154a through the contact holes 183a and 185a. The first drain electrode 175a may be connected to the second gate electrode 124b through a contact hole 184. The second source electrode 173b and the second drain electrode 175b may be respectively connected to the source region 153b and the drain region 155b of the second semiconductor 154b through the contact holes 183b and 185b. The connecting wire 179 may connect the first wire 127 disposed in the second area C2 and the second wire 129 disposed in the first area C1 through the contact holes 187 and 189 formed in the interlayer insulating layer 160.

For example, the data conductor may include a metal such as copper (Cu), aluminum (Al), silver (Ag), molybdenum (Mo), chromium (Cr), gold (Au), platinum (Pt), palladium (Pd), tantalum (Ta), tungsten (W), titanium (Ti), and nickel (Ni), or a metal alloy thereof. The data conductor may be made of, for example, an aluminum-based metal with a low Young's modulus such as aluminum or an aluminum alloy. In this case, when the connecting wire 179 disposed at the second bending portion B2 has small stress with respect to strain, even if it is bent at, for example, a small curvature radius of several hundred micrometers, it may not be cut or may not deteriorate. In some implementations, the data conductor may be formed with a multi-layered structure, for example, a three-layered structure of titanium/aluminum/titanium.

The first gate electrode 124a, the first source electrode 173a, and the first drain electrode 175a may form the switching transistor Qs together with the first semiconductor 154a, and the second gate electrode 124b, the second source electrode 173b, and the second drain electrode 175b may form the driving transistor Qd together with the second semiconductor 154b. When the gate electrodes 124a and 124b of the transistors (Qs and Qd) are disposed above the semiconductors 154a and 154b, the transistors may be referred to as top-gate transistors. The structure of the switching transistor Qs and the driving transistor Qd may be variously changed. For example, the transistors (Qs and Qd) may be bottom-gate transistors, the gate electrodes of which are disposed below the semiconductors.

A passivation layer 180 may be disposed on the data conductor. The passivation layer 180 corresponding to an insulating layer may have a flat surface for enhancing light emitting efficiency of an organic light emitting element to be disposed on the passivation layer. The passivation layer 180 may include an organic material. A contact hole 185c overlapping the second drain electrode 175b may be formed in the passivation layer 180. The passivation layer 180 may be disposed on the connecting wire 179 in the second bending portion B2. The connecting wire 179 may be sandwiched between the passivation layer 165 and the passivation layer 180. When the passivation layer 165 and the passivation layer 180 are formed as organic material layers, damage to the wire 179 when the second bending portion is bent may be avoided.

A pixel electrode 191 may be disposed on the passivation layer 180. The pixel electrode 191 of each pixel may be connected to the second drain electrode 175b through the contact hole 185c of the passivation layer 180. The pixel electrode 191 may be made of a reflective conductive material or a semi-transmittable conductive material. In some implementations, the pixel electrode 191 may be made of a transparent conductive material.

A pixel defining layer 360 having a plurality of openings for exposing the pixel electrode 191 may be disposed on the passivation layer 180. The opening of the pixel defining layer 360 for exposing the pixel electrode 191 may define each pixel area. The pixel defining layer 360 may be disposed on the passivation layer 180 overlapping the connecting wire 179 in the second bending portion B2.

A light emitting member 370 may be disposed on the pixel defining layer 360 and the pixel electrode 191. The light emitting member 370 may include a first organic common layer 371, a light emitting layer 373, and a second organic common layer 375 that are sequentially stacked.

The first organic common layer 371 may include at least one of a hole injecting layer and a hole transporting layer. When both of the hole injecting layer and the hole transporting layer are included, the hole injecting layer and the hole transporting layer may be sequentially stacked. The first organic common layer 371 may be disposed across the entire surface of the display area in which the pixels are disposed. In some implementations, the first organic common layer 371 may be disposed only on the respective pixel areas.

The light emitting layer 373 may be disposed on the pixel electrode 191 of the corresponding pixel. The light emitting layer 373 may be made of an organic material for intrinsically displaying light of a primary color such as red, green, and blue. In some implementations, the light emitting layer 373 may have a structure in which a plurality of organic material layers for displaying light of different colors are stacked. In some implementations, the light emitting layer 373 may include a white light emitting layer for displaying white.

The second organic common layer 375 may include, for example, at least one of an electron transporting layer and an electron injecting layer, and when both of the electron transporting layer and the electron injecting layer are included, the electron transporting layer and the electron injecting layer may be sequentially stacked.

A common electrode 270 serving to transmit a common voltage may be disposed on the light emitting member 370. The common electrode 270 may be made of a transparent conductive material such as ITO or IZO, or may be formed by thinly stacking a metal such as calcium (Ca), barium (Ba), magnesium (Mg), aluminum (Al), or silver (Ag), to have light permeability. The pixel electrode 191, the light emitting member 370, and the common electrode 270 of each pixel form a light-emitting device.

An encapsulation layer 390 may be disposed on the common electrode 270. The encapsulation layer 390 may encapsulate the light emitting member 370 and the common electrode 270 to prevent permeation of external moisture or oxygen. The encapsulation layer 390 may include at least one layer including an inorganic material, and may further include at least one layer including an organic material. The encapsulation layer 390 may be omitted from the second bending portion B2. A polarization layer that prevents reflection of external light may be disposed on the encapsulation layer 390.

A protection film 500 may be disposed below the substrate 110. The protection film 500 may be attached to the substrate 110 by an adhesive layer such as a PSA (pressure sensitive adhesive) or an OCA (optically clear adhesive). The protection film 500 may be a polymer film. The protection film 500 may be made of a plastic such as polyethylene terephthalate, polyethylene naphthalate, polyethylene sulfide, and polyethylene. The protection film 500 may be omitted from the second bending portion B2.

As the insulating layer, the first bending portion B1 disposed in the display area DA may include layers (hereinafter referred to as inorganic materials) (e.g., 111, 140, 160, and 390) including an inorganic material and layers (hereinafter referred to as organic layers) (180 and 360) including an organic material. The second bending portion B2 disposed in the non-display area NA may include the organic material layers (165, 180, and 360), but may not include the inorganic material layers, since an inorganic material layer may be vulnerable to cracks while being bent, such that a wire may be damaged due to the crack. When the second bending portion B2 does not include an inorganic material layer, the second bending portion B2 may be bent at a small curvature radius (e.g., about several hundred micrometers) without being damaged or deteriorating. Moreover, when the protection film 500 is not attached to a lower portion of the substrate 110 in the second bending portion B2, the second bending portion B2 may be further easily bent at a small curvature radius.

Hereinafter, a display device according to another exemplary embodiment will be described with reference to FIG. 8 and FIG. 9.

Figure 8:
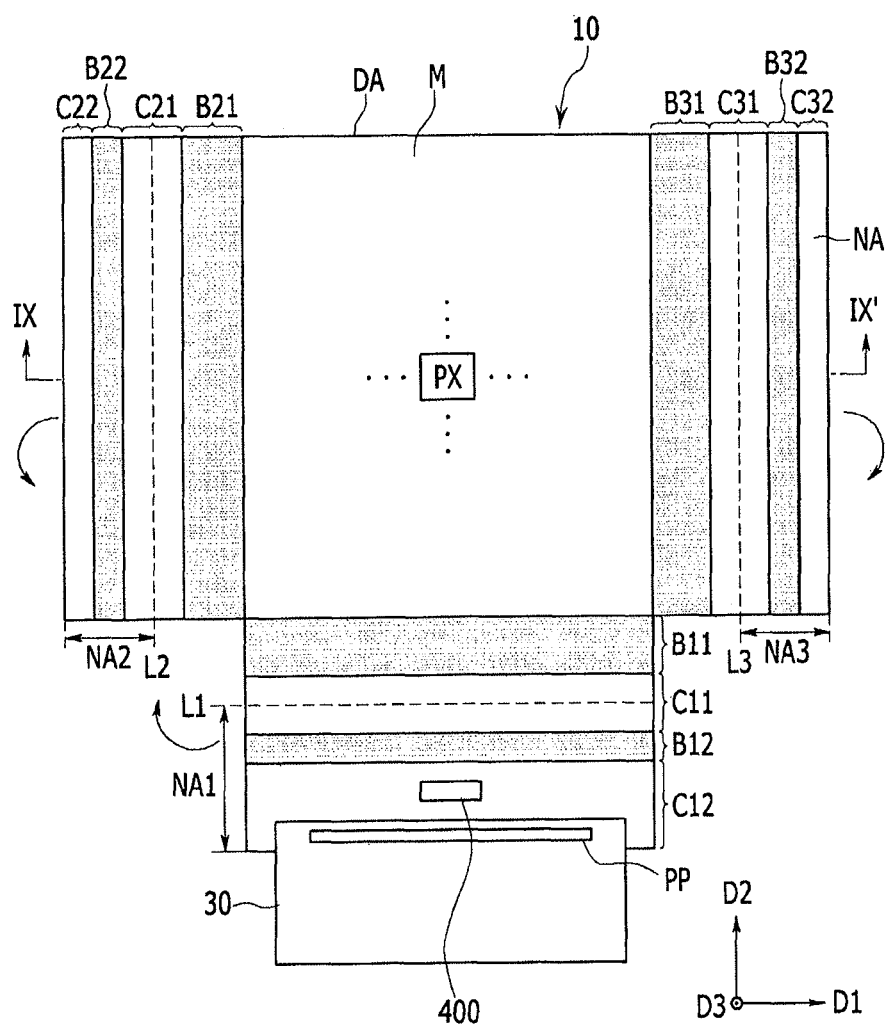
FIG. 8 illustrates a top plan view schematically depicting a state before a display device according to an exemplary embodiment is bent.
Figure 9:
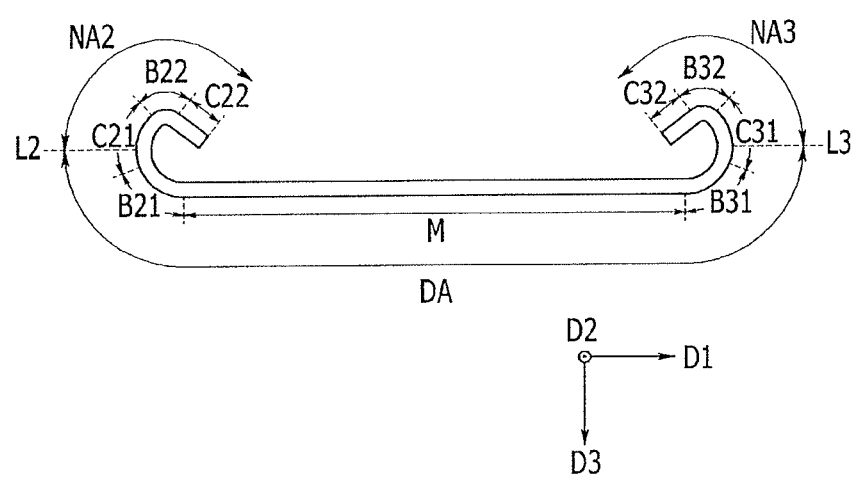
FIG. 9 schematically illustrates a cross-sectional view taken along line IX-IX' after the display device illustrated in FIG. 8 is bent.

FIG. 8 illustrates a top plan view schematically depicting a state before a display device according to another exemplary embodiment is bent, and FIG. 9 schematically illustrates a cross-sectional view taken along line IX-IX' after the display device illustrated in FIG. 8 is bent.

Referring to FIG. 8, a display panel 10 may include a display area DA and non-display areas NA1, NA2, and NA2 outside the display area. Before the display panel 10 is bent, a non-display area NA1 may be disposed at a lower side of the display area DA, a non-display area NA2 may be disposed at a left side of the display area DA, and a non-display area NA3 may be disposed at a right side of the display area DA. Boundaries L1, L2, and L3 of the display area DA and the non-display areas NA1, NA2, and NA2 are indicated by dotted lines, the inside area of the dotted line corresponding to the display area DA. Unlike the aforementioned exemplary embodiment in which only the lower side area of the display panel 10 is bent, left and right side areas of the display panel 10 as well as a lower side area thereof may be bent in the present exemplary embodiment. The display panel 10 may include first and second bending portions B11 and B12 at a lower side thereof, first and second bending portions B21 and B22 at a left side thereof, and first and second bending portions B31 and B32 at a right side thereof, in a periphery of the display area DA. A main area M, which is a substantially rectangular area inside the first bending portions B11, B21, and B31 of the display area DA, is not bent, but instead may be maintained to be substantially flat.

In the lower side area of display panel 10, the first and second bending portions B11 and B12 may be disposed as in the exemplary embodiment of FIG. 1. For example, the first bending portion B11 may be disposed in the display area DA close to the non-display area NA1, and the second bending portion B12 may be disposed in the non-display area NA1. A first area C11 may be disposed between the first bending portion B11 and the second bending portion B12, and a second area C12 may be disposed outside the second bending portion B12. A pad portion PP may be disposed in the second area C12, and a flexible printed circuit board 30 may be attached to the pad portion PP. Unlike the exemplary embodiment of FIG. 1, an integrated circuit chip 400 corresponding to a driver may be mounted on the second area C12. The integrated circuit chip 400 may be mounted on the flexible printed circuit board 30 as a tape carrier package (TCP).

In the left side area of the display panel 10, the first and second bending portions B21 and B22 may be disposed in a manner similar to the first and second bending portions B11 and B12 in the lower side area thereof. For example, the first bending portion B21 may be disposed in the display area DA close to the non-display area NA2, and the second bending portion B22 may be disposed in the non-display area NA2. A first area C21 may be disposed between the first bending portion B21 and the second bending portion B22, and a second area C22 may be disposed outside the second bending portion B22. The first area C21 may include the boundary L2 of the display area DA and the non-display area NA2. A gate driver may be integrated in the second area C22.

In the right side area of the display panel 10, the first and second bending portions B31 and B32 may be disposed in the same manner as the first and second bending portions B21 and B22 in the right side area thereof. For example, the first bending portion B31 may be disposed in the display area DA close to the non-display area NA3, and the second bending portion B32 may be disposed in the non-display area NA3. A first area C31 may be disposed between the first bending portion B31 and the second bending portion B32, and a second area C32 may be disposed outside the second bending portion B32. The first area C31 may include the boundary L3 of the display area DA and the non-display area NA3. A gate driver may be integrated in the second area C32.

In the lower side area of the display panel 10, the first and second bending portions B11 and B12 may be respectively bent based on different bending axes (e.g., X1 and X2) as shown in FIG. 4, and the aforementioned description made in relation to FIG. 4 may be identically applied thereto.

In the left and right areas of the display panel 10, the first and second bending portions (B21, B22, B31, and B32) may be bent as shown in FIG. 9, and may be bent in the same manner as the first and second bending portions B11 and B12 of the lower side area.

Referring to FIG. 9, in the left side area of the display panel 10, the first and second bending portions B21 and B22 may be bent based on different bending axes extending in the second direction D2. The second bending portion B22 may be bent at a smaller curvature radius than that of the first bending portion B21. In the right side area of the display panel 10, the first and second bending portions B31 and B32 may be bent based on different bending axes extending in the second direction D2. The second bending portion B32 may be bent at a smaller curvature radius than that of the first bending portion B31. The curvature radius of the first bending portion B21 of the left side area and the curvature radius of the first bending portion B31 of the right side area may be equal or different. The curvature radius of the second bending portion B22 of the left side area and the curvature radius of the second bending portion B32 of the right side area may be equal or different. The curvature radiuses of the first bending portions B21 and B31, for example, may be equal to or greater than about 1 mm, or, for example, about 2 mm to about 6 mm. The curvature radiuses of the second bending portions B22 and B32, for example, may be less than about 1 mm, or, for example, about 0.1 mm to about 0.4 mm.

When the display panel 10 is viewed from the front side thereof, the first areas C21 and C31 may respectively form one edge of the display panel 10 (e.g., a left edge or a right edge). The second areas C22 and C32 may not be substantially parallel to the main area M, which corresponds to an area in which the display panel 10 is not bent. The second areas C22 and C32 may be directed toward the main area M. The second bending portions B22 and B32 may be covered by the first bending portions B21 and B31 or by the main area M, such that the second bending portions B22 and B32 are not viewable from the front side of the display panel 10.

As such, by respectively bending the left and right sides of the display panel 10 twice in the first and second bending portions (B21, B22, B31, and B32), a dead space may be removed or minimized in a direction parallel to the first direction D1. The first bending portions B21 and B31 may be disposed in the display area DA, and some of the first areas C21 and C31 may be disposed in the display area DA. Thus, a display area may be enlarged from the main area M to the first areas C21 and C31. Further, when the areas (B21, B31, C21, and C22) form the curved surfaces, a lateral surface of the display device may be designed to be curved. In some implementations, the first and second bending portions may be disposed at only one of the left and right sides of the display panel 10, and the other may not be bent.

Hereinafter, a supporter for maintaining a bent state of the display panel 10 will be described with reference to FIG. 10 to FIG. 15.

Figure 10:
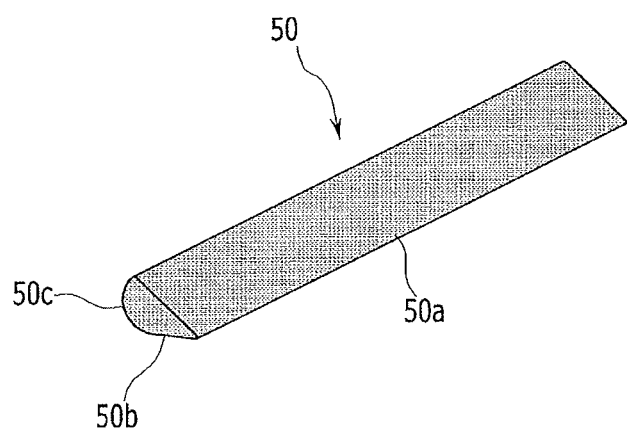
FIG. 10 illustrates a perspective view of a supporter according to an exemplary embodiment.
Figure 11:
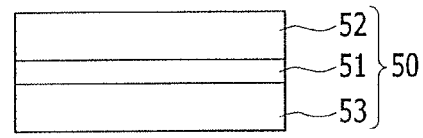
FIG. 11 illustrates a stacked structure of the supporter illustrated in FIG. 10.
Figure 12:
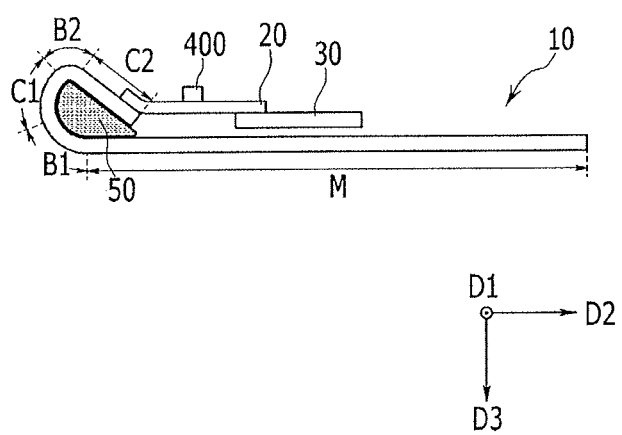
FIG. 12 illustrates a side view of a state in which the supporter illustrated in FIG. 10 is provided in the display device illustrated in FIG. 4.
Figure 13:
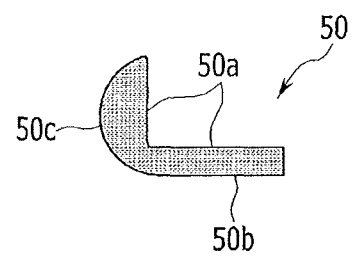
FIG. 13 and FIG. 14 respectively illustrate a cross-sectional view of a supporter according to exemplary embodiments.
Figure 14:
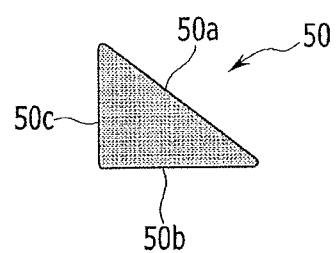
Figure 15:
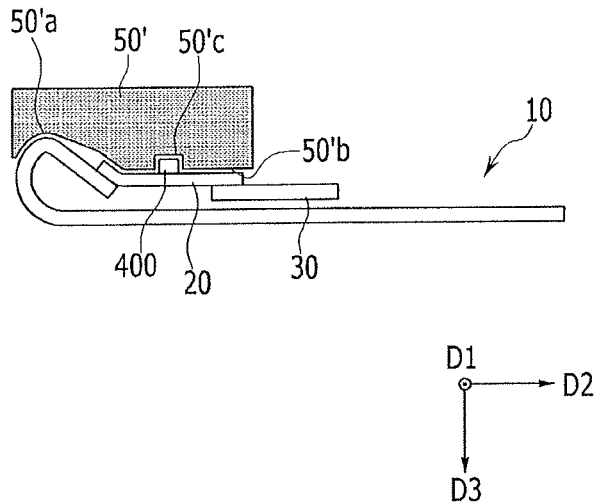
FIG. 15 illustrates a side view of a state in which the supporter according to an exemplary embodiment is provided in the display device illustrated in FIG. 4.

FIG. 10 illustrates a perspective view of a supporter according to an exemplary embodiment, FIG. 11 illustrates a stacked structure of the supporter illustrated in FIG. 10, and FIG. 12 illustrates a side view of a state in which the supporter illustrated in FIG. 10 is provided in the display device illustrated in FIG. 4. FIG. 13 and FIG. 14 respectively illustrate a cross-sectional views of supporters according to exemplary embodiments. FIG. 15 illustrates a side view of a state in which the supporter according to an exemplary embodiment is provided in the display device illustrated in FIG. 4.

Referring to FIG. 10 and FIG. 12, a supporter 50 may be disposed in a bending interspace limited by the first and second bending portions B1 and B2 and the first and second areas C1 and C2 of the display panel 10. For example, the first and second bending portions B1 and B2 and the first and second areas C1 and C2 may be bent to wrap around most of the supporter 50. The supporter 50 may be thin and long, and may include first and second surfaces 50a and 50b, which are flat in a length direction to fit in the bending interspace, and a third surface 50c, which is a curved surface. The first surface 50a of the supporter 50 may correspond to the second area C2 of the display panel 10, the second surface 50b may correspond to the main area M, and the third surface 50c may correspond to the first bending portion B1 and the first area C1. A vicinity of a border of the first surface 50a and the third surface 50c may correspond to the second bending portion B2.

The first surface 50a of the supporter 50 may be attached to the main area M of the display panel 10, and the second surface 50b may be attached to the second area C2 of the display panel 10. In some implementations, the third surface 50c of the supporter 50 may be attached to the first bending portion B1 and/or the first area C1 of the display panel 10. Accordingly, resilience of the first bending portion B1 and the second bending portion B2 is restrained, thus the bent curvature may be maintained, thereby maintaining a predetermined bent state of the display panel 10. Further, even if an external force were to be applied to a bent portion, since the supporter 50 is positioned in the bending interspace to support the bent portion, it may be possible to prevent the bent portion, for example, from being pressed or deformed in a direction substantially parallel to a third direction D3, thereby preventing elements or wires from being damaged. The supporter 50 may be disposed in the left and right bending interspaces of the display panel 10 shown in FIG. 9 in the same manner as shown in FIG. 12.

Referring to FIG. 11, the supporter 50 may include a support layer 51 and adhesive layers 52 and 53 that are respectively disposed on opposite surfaces of the support layer. The support layer 51 may be made of, for example, a plastic such as polypropylene, polyethylene terephthalate, polyimide, or polyolefin. The adhesive layers 52 and 53 may be provided to attach the display panel 10 to the supporter 50. An acryl-based resin, an epoxy-based resin, or the like may be used as the adhesive layers 52 and 53, as examples. Each of the adhesive layers 52 and 53 may include a plurality of layers. For example, the adhesive layers 52 and 53 may include a cushion layer between adhesive layers. The adhesive layer may include, for example, an acryl-based adhesive material, and the cushion layer may include, for example, a polyolefin.

The supporter 50 may be formed to have various shapes in addition to the shape shown in FIG. 12. Referring to FIG. 13, the supporter 50 may include a first surface 50a corresponding to the second area C2 of the display panel 10 in the length direction, a flat second surface 50b corresponding to the main area M, and a curved third surface 50c corresponding to the first bending portion B1 and the first area C1. The main area M of the display panel 10 may be attached to the flat second surface 50b, and the first bending portion B1 and the first area C1 may be attached to the curved third surface 50c. The first surface 50a of the supporter 50 may include two surfaces crossing each other, for example, a substantially parallel surface to the second surface 50b and a surface that is substantially perpendicular to the second surface 50b. Accordingly, it may not be necessary to attach the second area C2 of the display panel 10 to the first surface 50a of the supporter 50, and a position of the second area C2 may be free.

Referring to FIG. 14, the supporter 50 may include a first surface 50a corresponding to the second area C2 of the display panel 10 in the length direction, a second surface 50b corresponding to the main area M, and a third surface 50c corresponding to the first bending portion B1 and the first area C1. All of the first, second, and third surfaces 50a, 50b, and 50c may be flat, and the main area M and the second area C2 of the display panel 10 may be attached to the second surface 50b and the first surface 50a. The first bending portion B1 and the first area C1 of the display panel 10 may not closely contact the third surface 50c but may be spaced apart from the third surface 50c. An edge between the first surface 50a and the third surface 50c may be rounded to correspond to the curvature radius of the second bending portion B2.

Referring to FIG. 15, a supporter 50' may be disposed in an external space other than the bending interspace to support the bent portion. The supporter 50' may include a recess portion 50'a that is disposed at a lower portion thereof, and at least some of the second bending portion B2 and the first and second areas C11 and C12 may be disposed in the recess portion 50'a. A flat bottom surface 50'b in which the recess portion 50'a is not formed at the lower portion of the supporter 50' may press the first flexible printed circuit board 20. Thus resilience of the second bending portion B2 may be restrained. A groove 50'c corresponding to the driving circuit chip 400 mounted on the first flexible printed circuit board 20 may be formed on the flat bottom surface 50'b of the supporter 50'. The groove 50'c may accommodate the driving circuit chip 400. Accordingly, the flat bottom surface 50'b may press the first flexible printed circuit board 20 without interruption by the driving circuit chip 400. When the supporter 50', for example, is fixed so as to not move inside a case of the display device, the bent area and the first flexible printed circuit board 20 may be supported by the recess portion 50'a and the flat bottom surface 50'b of the supporter 50', thereby maintaining the bent state of the first and second bending portions B1 and B2.

Various supporters for maintaining the bent state and supporting the bent portion other than the supporters (50 and 50') shown in FIG. 12 to FIG. 15 may be disposed in the bending interspace or the external space.

By way of summation and review, glass may be used as the substrate of a display device. However, a substrate made of the glass is heavy and may be easily damaged. In addition, since the glass substrate is rigid, it may be difficult to modify the display device. Recently, display devices using a flexible substrate that is light, has impact resistance, and is easily modified, have been developed.

The display device using the flexible substrate may be designed such that an edge of a display panel provided with a pad portion, to which a flexible printed circuit board (FPCB) for transmitting a signal is attached, may be bent, thereby reducing a dead space, as compared to a display device using a rigid substrate. However, since the bent portion is an area in which an image is not generally displayed, the bent portion and an area adjacent thereto become a dead space. A bezel width of a display device may be decreased and internal space utilization of the display device may be enhanced by reducing the dead space. Accordingly, it is desirable that a display device be compactly designed.

Embodiments are direct to a display device in which dead space may be minimized. According to embodiments, as the dead space decreases, it is possible to decrease a bezel width, and it is possible to ensure an additional space for disposing other elements. Accordingly, a predetermined display area may be ensured, and a display device may be further variously designed. In addition, a design margin may be enhanced.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:
1. A display device, comprising:
 a display panel including a display area and a first non-display area, wherein the display panel includes:
  a main area in the display area, the main area being substantially flat;
  a first bending portion in the display area, the first bending portion being bent at a first curvature radius and having a first center of curvature;
  a second bending portion in the first non-display area, the second bending portion being bent at a second curvature radius and having a second center of curvature different from the first center of curvature;
a first area between the first bending portion and the second bending portion; and
a second area outside the second bending portion in the first non-display area, the second area extending from the second bending portion in an extending direction that points toward a surface of the main area, wherein
a shortest distance between the second area and the main area in a thickness direction of the main area is smaller than a shortest distance between the second bending portion and the main area in the thickness direction of the main area, and
the second curvature radius is smaller than the first curvature radius by at least 0.6 mm.

2. The display device as claimed in claim 1, wherein the second area is bent at a curvature radius that is greater than the curvature radius of the first area or is substantially flat.

3. The display device as claimed in claim 1, wherein the first area is bent at a curvature radius that is greater than the first curvature radius.

4. The display device as claimed in 1, wherein the first area is partially located in the display area and partially located in the first non-display area.

5. The display device as claimed in 1, further comprising a pad portion that is disposed in the second area.

6. The display device as claimed in claim 1, wherein the second bending portion is in an overlapping relationship with the first bending portion or with the main area in a direction perpendicular to the surface of the main area.

7. The display device as claimed in claim 1, wherein the first curvature radius is equal to or greater than about 1 mm.

8. The display device as claimed in claim 1, further comprising a supporter including a recess portion that is located on the second bending portion and accommodates the second bending portion.

9. The display device as claimed in claim 1, wherein the display panel includes:
a second non-display area;
a third bending portion that is located in the display area and is bent at a third curvature radius based on a bending axis extending in a different direction from a bending axis of the first bending portion; and
a fourth bending portion that is located in the second non-display area and is bent at a fourth curvature radius.

10. The display device as claimed in claim 1, wherein the first bending portion in the display area includes at least one inorganic insulating layer while the second bending portion includes no inorganic insulating layer.

11. The display device as claimed in claim 5, further comprising a flexible printed circuit board that is attached to the pad portion.

12. The display device as claimed in claim 6, wherein an edge of the second area faces the surface of the main area.

13. The display device as claimed in claim 7, wherein the second curvature radius is less than about 1 mm.

14. The display device as claimed in claim 9, wherein the display panel includes:
a third area between the third bending portion and the fourth bending portion; and
a fourth area outside the fourth bending portion in the second non-display area, wherein
the fourth area is located such that an edge thereof is toward the main area.

15. The display device as claimed in claim 11, further comprising a driving circuit chip that is mounted on the flexible printed circuit board or the second area.

16. The display device as claimed in claim 14, wherein the display panel includes:
a third non-display area;
a fifth bending portion that is located in the display area and is bent at a fifth curvature radius based on a bending axis extending in a different direction from a bending axis of the first bending portion; and
a sixth bending portion that is located in the second non-display area and is bent at a sixth curvature radius.

17. A display device, comprising:
a display panel including a display area and a first non-display area,
wherein the display panel includes:
a first bending portion in the display area, the first bending portion being bent at a first curvature radius;
a second bending portion in the first non-display area, the second bending portion being bent at a second curvature radius smaller than the first curvature radius by at least 0.6 mm;
a first area between the first bending portion and the second bending portion;
a second area outside the second bending portion in the first non-display area; and
a supporter located in an inner space defined by the first bending portion, the first area, the second bending portion, and the second area.

18. The display device as claimed in claim 17, wherein at least one of the first area and the second area is attached to the supporter.

19. The display device as claimed in claim 17, wherein the supporter includes a support layer and adhesive layers respectively located on opposite surfaces of the support layer.

20. The display device as claimed in claim 17, wherein the supporter includes:
a first surface that is flat and corresponds to the second area;
a second surface that is flat and corresponds to a main area of the display panel; and
a third surface that is curved and corresponds to the first bending portion and the first area.

21. The display device as claimed in claim 17, wherein the supporter includes:
a first surface that corresponds to the second area;
a second surface that is flat and corresponds to a main area of the display panel; and
a third surface that is curved and corresponds to the first bending portion and the first area, wherein
the first surface includes two surfaces crossing each other.

22. The display device as claimed in claim 17, wherein the supporter includes:
a first surface that is flat and corresponds to the second area;
a second surface that is flat and corresponds to a main area; and
a third surface that is flat and corresponds to the first bending portion and the first area.

23. The display device as claimed in claim 19, wherein the support layer includes a plastic.

24. The display device as claimed in claim 20, wherein:
the first surface is attached to the second area, and
the second surface is attached to the main area.

25. The display device as claimed in claim 21, wherein:
one of the two surfaces is substantially parallel to the second surface, and
the other of the two surfaces is substantially perpendicular to the second surface.

26. The display device as claimed in claim 22, wherein:
the first surface is directly attached to the second area,
the second surface is directly attached to the main area, and
the third surface is spaced apart from the first bending portion and the first area.

27. A display device, comprising:
a supporter that includes:
   a flat first surface,
   a first bending portion extending from the flat first surface, the first bending portion having a first curvature radius,
   a second bending portion having a center of curvature different from a center of curvature of the first bending portion and having a second curvature radius, the second curvature radius being at least 0.6 mm smaller than the first curvature radius, and
   a second flat surface extending from the second bending portion; and
a display panel including a display area and a first non-display area, wherein
   the display area contacts the first flat surface and the first bending portion of the supporter, and
   a first portion of first non-display area has a bending shape that conforms to the second curvature radius of the supporter.

28. The display device as claimed in claim 27, wherein a second portion of first non-display area has a flat shape that contacts and conforms to the second flat surface of the supporter.

29. The display device as claimed in claim 27, wherein the supporter further includes a first area between the first bending portion and the second bending portion.

30. The display device as claimed in claim 29, wherein the display panel includes:
   a first bending portion in the display area having a shape that conforms with the first bending portion of the supporter, the first bending portion including at least one inorganic insulating layer; and
   a second bending portion in the first non-display area that corresponds to the first portion of first non-display area, the second bending portion having a shape that conforms with the second bending portion of the supporter, the second bending portion including no inorganic insulating layers.

* * * * *